United States Patent
Day

(10) Patent No.: US 12,537,489 B2
(45) Date of Patent: Jan. 27, 2026

(54) INTEGRATED DIRECTIONAL COUPLER FOR BROADBAND AMPLIFIER

(71) Applicant: Analog Devices, Inc., Wilmington, MA (US)

(72) Inventor: Christopher J. Day, Santa Rosa, CA (US)

(73) Assignee: Analog Devices, Inc., Wilmington, MA (US)

(*) Notice: Subject to any disclaimer, the term of this patent is extended or adjusted under 35 U.S.C. 154(b) by 573 days.

(21) Appl. No.: 18/057,597

(22) Filed: Nov. 21, 2022

(65) Prior Publication Data

US 2023/0170861 A1 Jun. 1, 2023

Related U.S. Application Data

(60) Provisional application No. 63/284,955, filed on Dec. 1, 2021.

(51) Int. Cl.
*H03F 1/38* (2006.01)
*H03F 3/24* (2006.01)
*H03G 3/30* (2006.01)

(52) U.S. Cl.
CPC ........... *H03F 3/245* (2013.01); *H03G 3/3042* (2013.01); *H03F 2200/129* (2013.01); *H03F 2200/451* (2013.01); *H03G 2201/103* (2013.01); *H03G 2201/307* (2013.01)

(58) Field of Classification Search
CPC .................................. H03F 1/38; H03F 1/34
USPC .............................................. 330/150, 98, 84
See application file for complete search history.

(56) References Cited

U.S. PATENT DOCUMENTS

| | | | | |
|---|---|---|---|---|
| 7,276,965 B1* | 10/2007 | Sutardja | ................ | H03F 1/34 330/99 |
| 7,317,902 B2* | 1/2008 | Johnson | ................ | H03G 3/3036 455/127.1 |
| 7,795,965 B2* | 9/2010 | Suzuki | ................ | H03F 3/193 330/289 |
| 8,872,590 B2* | 10/2014 | Kan | ................ | H03F 1/223 330/311 |

* cited by examiner

*Primary Examiner* — Henry Choe
(74) *Attorney, Agent, or Firm* — ArentFox Schiff LLP

(57) ABSTRACT

Systems and methods that integrate a directional coupling function with directivity that does not have output loss are disclosed. For example, a power amplifier circuit arrangement includes an input terminal to receive an input signal; amplifier circuitry including a first amplifier stage, a second amplifier stage, and a virtual ground node, where an input of the first amplifier stage is coupled to the input terminal, an output of the first amplifier stage is coupled to an input of the second amplifier stage via the virtual ground node, and an output of the second amplifier stage is coupled to the input of the first amplifier stage via feedback circuitry; an output terminal coupled to the output of the second amplifier stage, the output terminal to output an amplified signal; and a directional coupler terminal coupled to the virtual ground node.

19 Claims, 8 Drawing Sheets

INTEGRATED DIRECTIONAL COUPLER FOR BROADBAND AMPLIFIER

CROSS REFERENCE TO RELATED APPLICATIONS

The present application claims priority to and the benefit of the U.S. Provisional Patent Application No. 63/284,955 entitled "INTEGRATED DIRECTIONAL COUPLER FOR BROADBAND AMPLIFIER" and filed Dec. 1, 2021, which is hereby incorporated by reference in its entirety as if fully set forth below and for all applicable purposes.

TECHNICAL FIELD OF THE DISCLOSURE

The present disclosure generally relates to electronic devices and, more particularly, to broadband amplifiers

BACKGROUND

The first cable communication systems started to appear in the early '50s. Even with the rapid changes in technology and distribution methods, cable has maintained a prominent position as a conduit for the distribution of data. Wireless communication systems are more recent, with one prominent example being wireless cellular (mobile) communication systems, with Long Term Evolution (LTE) and $5^{th}$ generation (5G) being the latest generation technologies at the moment. Both, systems used for cable communication such as cable television networks and systems used for wireless communication such as LTE or 5G, are radio systems in that they transmit and receive signals in the form of electromagnetic waves in the radio frequency (RF) range of approximately 3 kiloHertz (kHz) to 300 gigaHertz (GHz). In both of these types of systems a power amplifier (PA) for amplifying RF signals prior to transmission is a crucial component.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

The systems, methods, and devices of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating integrated directional couplers for broadband amplifiers, proposed herein, it might be useful to first understand phenomena that may come into play in systems that use PAs. The following foundational information may be viewed as a basis from which the present disclosure may be properly explained. Such information is offered for purposes of explanation only and, accordingly, should not be construed in any way to limit the broad scope of the present disclosure and its potential applications.

The main problem in RF PAs today is achieving high levels of RF power with reduced DC power consumption. In many systems an output coupling and detection device is needed for automated gain control (AGC) and monitoring functions. The output coupler always lowers the effective PA output leading to a reduction in overall system efficiency. To separate the outgoing forward signal from reverse reflected signals a coupling device (i.e., a coupler) with directional characteristics is needed.

Figure 1:
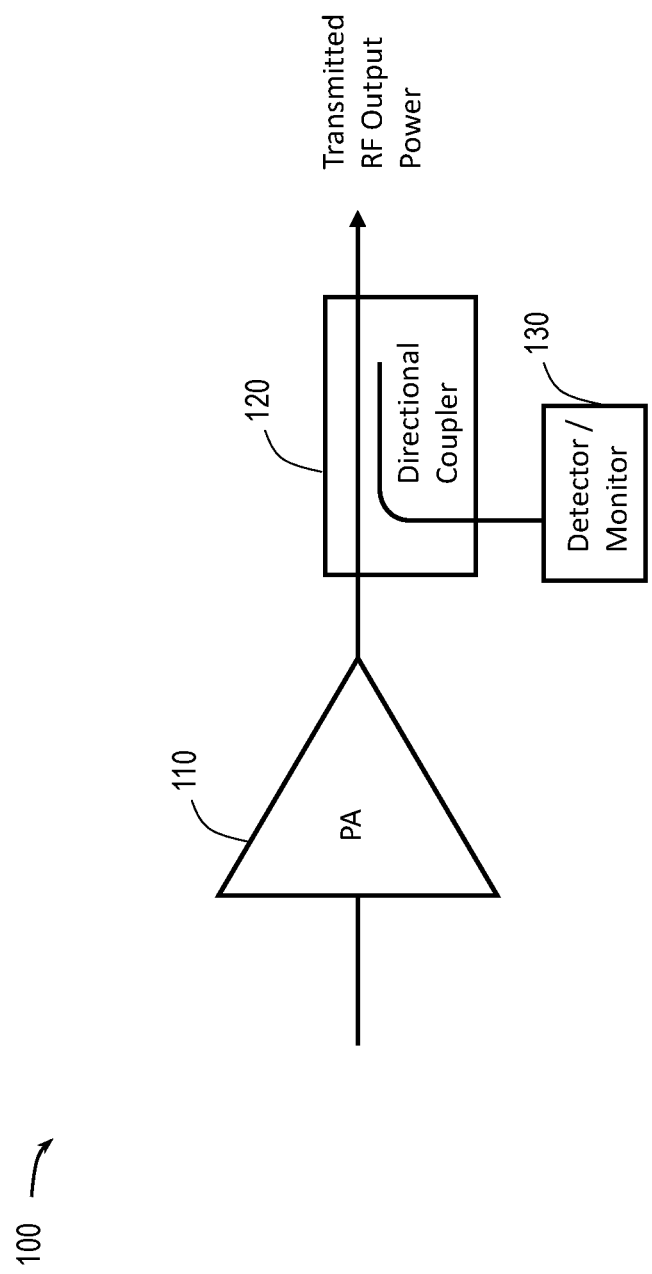
FIG. 1 provides a block diagram of a system including a power amplifier (PA) with a directional coupler.

In many PA systems an output coupling circuit is needed to represent the level of RF power leaving the PA. In some conventional systems a directional coupler is used, e.g., as illustrated in FIG. 1. FIG. 1 provides a block diagram of a system 100 including a PA 110 with a directional coupler 120. The PA 110 may receive an input signal (e.g., an RF signal), amplify the input signal, and provide the amplified signal at its output for transmission. The directional coupler 120 may couple at least a portion of the transmitted RF output power to the detector/monitor 130 (e.g., for measurements and/or monitoring). One downside of such a system is that directional couplers always have some amount of insertion loss leading to a reduction in net RF power delivered for the application. This leads to a loss of PA efficiency, which is one of the most competitive parameters that differentiate PAs. The role of the directional coupler and detector/monitor functions are to generate a signal whose output is proportional to the transmitted RF output power independent of any reflected power coming from the output network.

Figure 2:
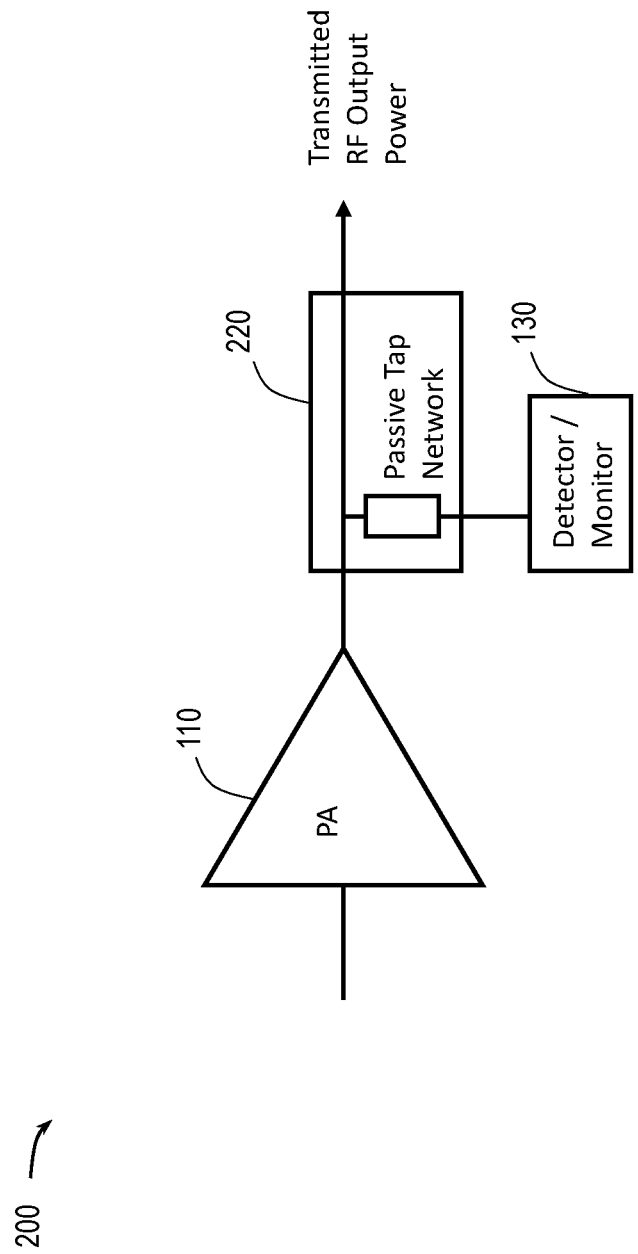
FIG. 2 provides a block diagram of a system including a PA with a passive tap network at a PA output.

In some conventional systems, another means of determining the RF output power is used, namely, to simply locate a passive network such as a resistor on the PA output, e.g., as illustrated in FIG. 2. FIG. 2 provides a block diagram of a system 200 including a PA 110 with a passive tap network 220 at a PA output. The passive tap network 220 may couple at least a portion of the transmitted RF output power and a portion of reflected signal to the detector/monitor 130 (e.g., for measurements and/or monitoring). Because energy is being pulled from the RF output there is still an insertion loss penalty. In addition, a simple resistive tap will not have directional properties. Without directional capabilities the detector/monitor function will report erroneous information to any AGC or status monitoring systems in use. This could lead to incorrect levels of automatically controlled RF output levels and correspondingly high levels of distortion.

Figure 3:
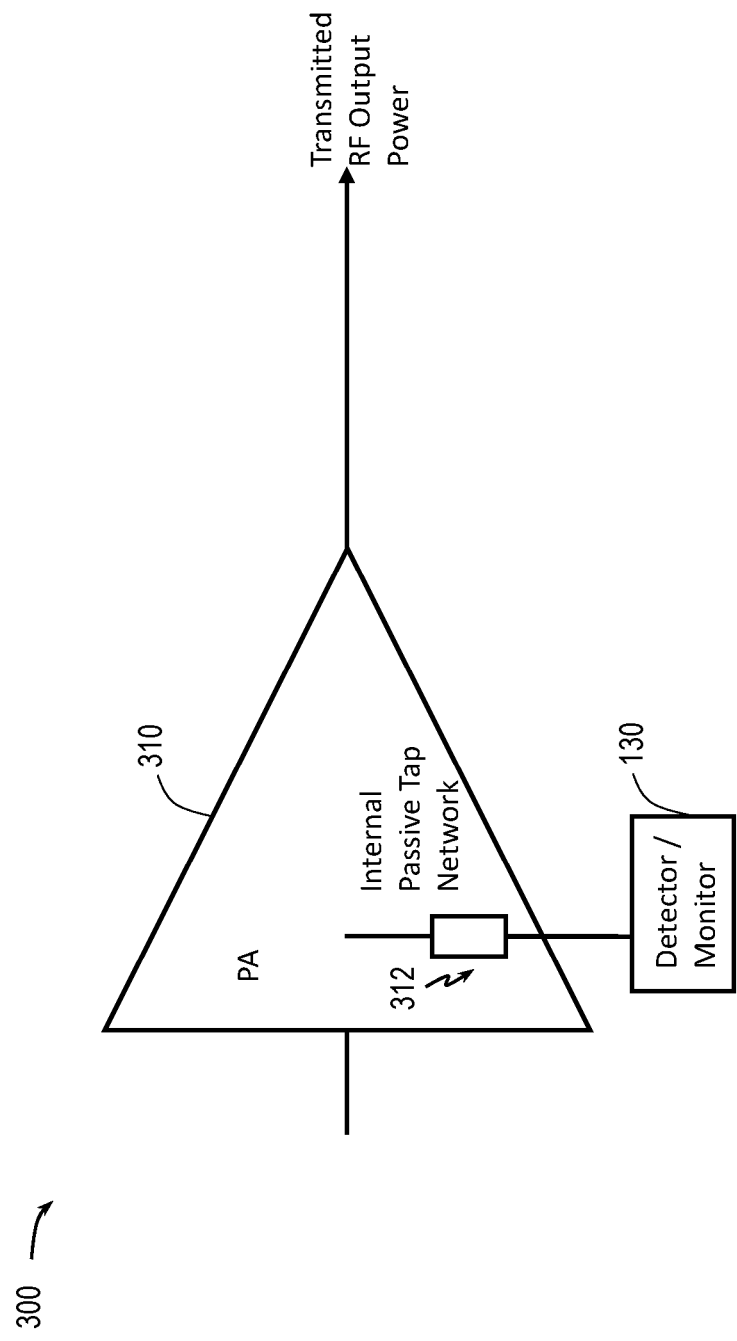
FIG. 3 provides a block diagram of a system including a PA with an internal passive tap network.

The simple resistive tap approach as described above can also be extended to internal nodes within the power amplifier itself, e.g., as illustrated in FIG. 3. FIG. 3 provides a block diagram of a system 300 including a PA 310 with an internal passive tap network 312. The internal passive tap network 312 may couple at least a portion of the transmitted RF output power and a portion of reflected signal to the detector/monitor 130 (e.g., for measurements and/or monitoring). However, a simple single-point tap network 312 may have poor directional properties.

Various embodiments of the present disclosure provide systems and methods that aim to improve on one or more of the above-described challenges by integrating a directional coupling function with directivity that does not have output loss. Embodiments of the present disclosure are based on carefully selecting circuit values within a broadband feedback amplifier commonly used in community antenna television (CATV) networks. In one aspect, novel broadband amplifier arrangements that provide a directional output for use in AGC and monitoring functions are described. Such arrangements are referred to as "integrated directional couplers for broadband amplifiers" and can be implemented with high levels of directivity meaning the coupled output represents the forward going output without any of the reflected signal.

According to an aspect of the present disclosure, a power amplifier with an integrated directional coupler may include an input terminal, an output terminal, a directional coupler terminal, and amplifier circuitry coupled to the input terminal, output terminal, and directional coupler terminal. The input terminal may receive an input signal. The amplifier circuitry may amplify the input signal. The amplifier circuitry may be a feedback amplifier. For instance, the amplifier circuitry may include a first amplifier stage, a second amplifier stage, and feedback circuitry between an output of the second amplifier stage and an input of the first amplifier stage. The output terminal may output the amplified signal. The directional coupler terminal may output a signal (e.g., a measurement signal) indicative of a forward going signal from the first amplifier stage to the second amplifier stage but without a reverse going signal (or reflective signal) from the output terminal. Stated differently, at the directional coupler terminal, at least a portion of a forward going signal is present while a reverse going signal is absent (e.g., about zero power).

To provide directivity at the directional coupler terminal, the amplifier circuitry may include a virtual ground node between the first amplifier stage and the second amplifier stage, and the directional coupler terminal may be coupled to the virtual ground node. For instance, an input of the first amplifier stage may be coupled to the input terminal, an output of the first amplifier stage may be coupled to the input of the second amplifier stage via the virtual ground node, and an output of the second amplifier stage may be coupled to the output terminal. In certain aspects, the amplifier circuitry may include various circuit elements (e.g., transistors, resistors, etc.) selected to provide the virtual ground node (e.g., a virtual ground condition for the reverse going signal).

In some aspects, the power amplifier can optionally include nulling circuitry coupled between the output of the first amplifier stage and the input of the second amplifier stage. In some aspects, the nulling circuitry may include one or more passive elements. (e.g., any suitable combination of resistor(s), inductor(s), or capacitor(s)). In some aspects, the virtual ground node can be an internal node of the nulling circuitry, and the directional coupler terminal can be coupled to (e.g., directly connected to) a node upstream of the nulling circuitry and the node may be coupled to the virtual ground node at the nulling circuitry. Because a virtual ground condition exists for the reverse going signal at the nulling circuitry, the reflective signal will be absent at a node upstream (or in front) of the nulling circuitry. In other aspects, the power amplifier may not include the nulling circuitry, and the directional coupler terminal may be directly connected to the virtual ground node.

In some aspects, the feedback circuitry may comprise a resistive network including an internal node of the second amplifier stage. For instance, the feedback circuitry may include a first resistor coupled between the output of the second amplifier stage and the input of the second amplifier stage and a second resistor coupled between an internal node of the second amplifier stage and the input of the first amplifier stage.

In some aspects, the amplifier circuitry may be configured as a 2-stage series-shunt feedback amplifier. For instance, the first amplifier stage may include a first transistor having a gate coupled to the input of the first amplifier stage and a drain coupled to the output of the first amplifier stage. The second amplifier stage may include a second transistor having a gate coupled to the input of the second amplifier stage and a drain coupled to the output of the second amplifier stage. The internal node of the second amplifier stage to which the second transistor is coupled may be at a source of the second transistor.

In some aspects, the first amplifier stage may further include a third resistor coupled to the drain of the first transistor and a fourth resistor coupled to the source of the first transistor. The second amplifier stage may further include a fifth resistor coupled to the source of the second transistor. The first, second, third, fourth, and fifth resistors may be selected (or optimized) based on a source impedance at the input terminal and a load impedance at the output terminal to provide the virtual ground node (e.g., a reflective signal is about zero or has about zero power). In the case where a nulling circuit is coupled between an output of the first amplifier stage and the input of the second amplifier stage as discussed above, the selection or optimization may also include circuit elements of the nulling circuitry. Since the virtual ground condition can be dependent on the source impedance, variations in the source impedance can impact the directivity at the measurement port. In some aspects, the power amplifier may include buffer circuitry coupled between the input terminal and the input of the first amplifier stage, and a resistor can be coupled between the buffer circuitry and the input of the first amplifier stage. In this way, the response of the reverse or reflective signal may be less dependent on the source impedance. In some aspects, the second amplifier stage may optionally include transistors coupled in a cascode topology.

According to a further aspect of the present disclosure, an apparatus (e.g., an RF system, a CATV system, etc.) may include a power amplifier with an input terminal, output terminal, and a directional coupler terminal as discussed above, where the directional coupler terminal may operate as a measurement port. For instance, the apparatus may further include measurement circuitry coupled to the directional coupler terminal. In some instances, the measurement circuitry may monitor the signal output by the directional coupler terminal or perform any suitable detection. In some aspects, the apparatus or system may further include automatic gain control (AGC) circuitry to perform a gain adjustment based on the signal.

In some embodiments, integrated directional couplers for broadband amplifiers as described herein may be integrated in a GaAs die or any suitable technologies and may allow customers the ability to forgo the conventional approaches of using an external coupler with implied loss. Hence, integrated directional couplers for broadband amplifiers as described herein enable a direct increase in effective RF output power in systems. These and other advantages will become clear from further descriptions of various embodiments of integrated directional couplers for broadband amplifiers presented herein.

Some of the descriptions of integrated directional couplers for broadband amplifiers are provided herein with reference to wireless communication technologies because this is where PAs may be particularly useful, especially for mm-wave spectrum of 5G communication systems and/or for transistors implemented using deep sub-micron technologies. However, in general, various embodiments of integrated directional couplers for broadband amplifiers as described herein, are applicable to 5G communication systems operating at frequencies other than mm-wave frequencies (e.g., for sub-6 GHz frequency spectrum), to wireless communication systems of technologies other than 5G (e.g., Long Term Evolution (LTE) systems), as well as to systems other than wireless communication systems (e.g., cable communication systems, ultrasound, radar, remote sensing, audio compression, amplitude modulation, and synthesizers).

The exact design of integrated directional couplers for broadband amplifiers as described herein may be realized in many different ways, all of which being within the scope of the present disclosure. In one example of design variations according to various embodiments of the present disclosure, a choice can be made, individually for each of the transistors of the integrated directional couplers for broadband amplifiers as described herein, to employ field-effect transistors (FETs), e.g., metal-oxide-semiconductor (MOS) technology transistors (e.g., where various transistors may be N-type MOS (NMOS) or P-type MOS (PMOS) transistors), bipolar junction transistors (BJTs) (e.g., where various transistors may be NPN or PNP transistors), or a combination of one or more FETs and one or more BJTs. In another example, in various embodiments, a choice can be made, whether various transistors of the integrated directional couplers for broadband amplifiers as described herein are implemented as N-type transistors (e.g., NMOS or NPN transistors) or as P-type transistors (e.g., PMOS or PNP transistors). Although N-type transistors may be inherently faster than P-type transistors, P-type transistors may have other advantages in some deployment scenarios. In yet other examples of design variations, in various embodiments, a choice can be made as to what type of transistor architecture to employ. For example, any of the transistors of the transistor arrangements described herein that are implemented as FETs may be planar transistors or may be non-planar transistors such as FinFETs, nanowire transistors or nanoribbon transistors.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations. The innovations described herein can be embodied in a multitude of different ways, for example, as defined and covered by the claims or select examples.

In the following description, reference is made to the accompanying drawings, where like reference numerals or reference letters can indicate identical or functionally similar elements. For convenience, if a collection of drawings designated with different letters are present, e.g., FIGS. 4A-4B, such a collection may be referred to herein without the letters, e.g., as "FIG. 4." The drawings show, by way of illustration, embodiments that may be practiced. It is to be understood that other embodiments may be utilized, and structural or logical changes may be made without departing from the scope of the present disclosure. For example, elements illustrated in the drawings are not necessarily drawn to scale. Moreover, certain embodiments can include more elements than illustrated in a drawing and/or a subset of the elements illustrated in a drawing. Further, some embodiments can incorporate any suitable combination of features from two or more drawings. Therefore, the following detailed description of the drawings is not to be taken in a limiting sense.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. If used, the terms "substantially," "approximately," "about," etc., may be used to generally refer to being within +/−20% of a target value, e.g., within +/−10% of a target value, or within +/−5% of a target value, based on the context of a particular value as described herein or as known in the art.

As will be appreciated by one skilled in the art, various aspects of the present disclosure, in particular aspects of integrated directional couplers for broadband amplifiers as described herein, may be embodied in various manners—e.g., as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit,"

"arrangement," "module," or "system." At least some of the functions described in this disclosure may be implemented as an algorithm executed by one or more hardware processing units, e.g., one or more microprocessors, of one or more computers. In various embodiments, different steps, and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to various devices and systems (e.g., to various components and arrangements of components of RF devices or phased array systems, and/or their controllers, etc.) or be stored upon manufacturing of these devices and systems.

Figure 4A:
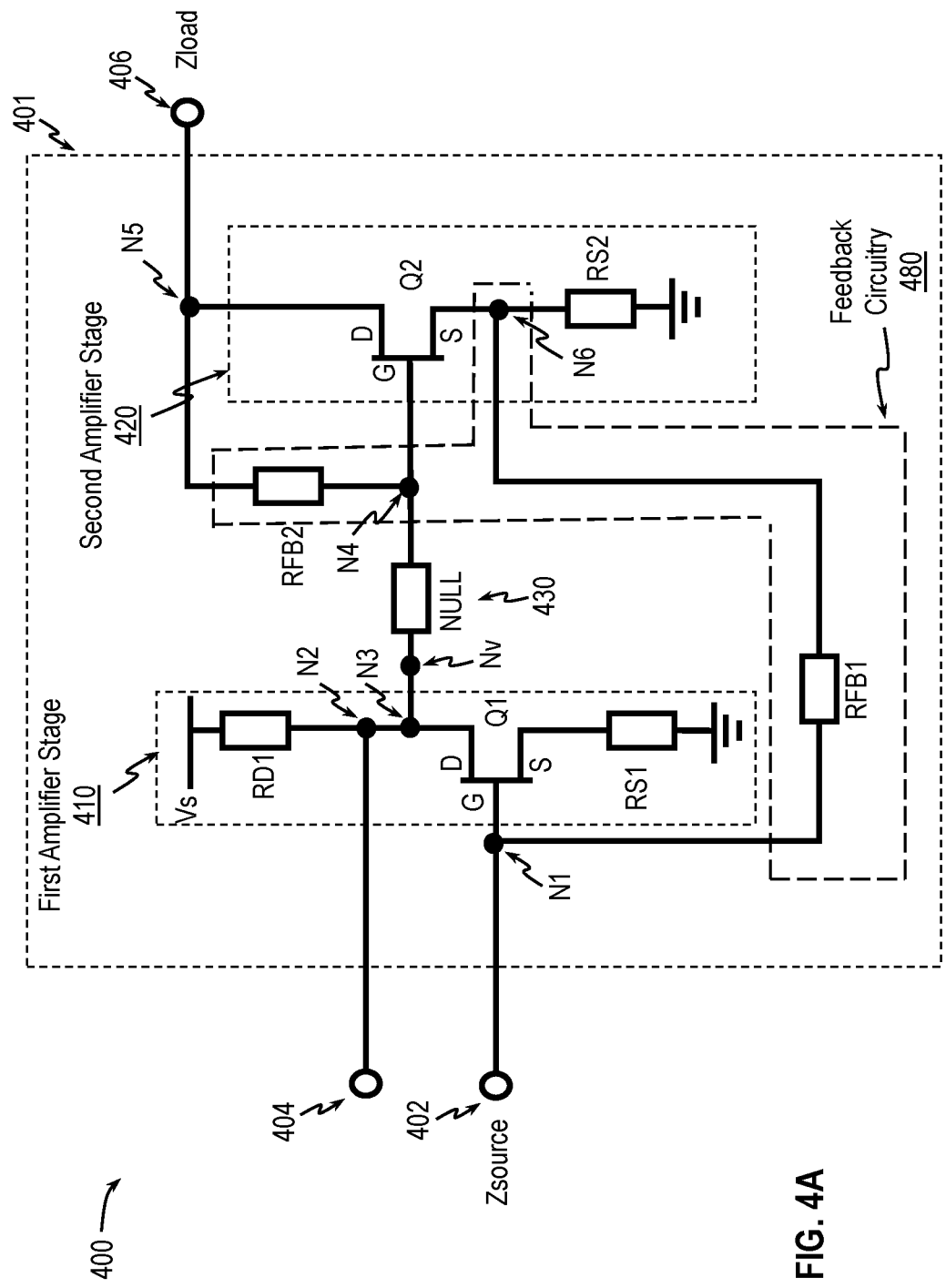
FIG. 4A provides an electric circuit diagram of a PA with an integrated directional coupler, according to some embodiments of the present disclosure.

FIG. 4A provides an electric circuit diagram of a PA 400 with an integrated directional coupler, according to some embodiments of the present disclosure. The PA 400 can be described using the simplified schematic of a 2-stage series-shunt feedback amplifier well matched to the port impedances Zsource and Zload. The high level of feedback used makes the forward gain a strong function of the resistors themselves and less on the transistor intrinsic parameters. It follows from this that the coupled measurement port here is directly proportional to the output signal.

As shown in FIG. 4A, the PA 400 may include an input terminal 402, an output terminal 406, a directional coupler terminal 404, and amplifier circuitry 401 coupled to the input terminal 402, the output terminal 406, and the directional coupler terminal 404 (e.g., a measurement port). The input terminal 402 may receive an input signal, the amplifier circuitry 401 may amplify the input signal, and the output terminal 406 may output the amplified signal.

As described above, the PA 400 is a 2-stage series-shunt feedback amplifier. In this regard, the amplifier circuitry 401 may include a first amplifier stage 410 and a second amplifier stage 420. The first amplifier stage 410 may include a transistor Q1, where a gate (shown by G) of Q1 may be coupled to an input (shown by the node N1) of the first amplifier stage 410, a drain (shown by D) of Q1 may be coupled to a supply voltage Vs via a resistor RD1, and a source (shown by S) of Q1 may be coupled to a ground potential via a resistor RS1. The drain of Q1 may be further coupled to an output (shown by node N3) of the first amplifier stage 410. The second amplifier stage 420 may include a transistor Q2, where a gate (shown by G) of Q2 may be coupled to an input (shown by the node N4) of the second amplifier stage 420, a drain (shown by D) of Q2 may be coupled to an output (shown by node N5) of the second amplifier stage 420, and a source (shown by S) of Q2 may be coupled to a ground potential via a resistor RS2. The output of the first amplifier stage 410 may be coupled to the input of the second amplifier stage 420. The amplifier circuitry 401 may further include feedback circuitry 480 coupled between the output of the second amplifier stage 420 and the input of the first amplifier stage 410. More specifically, the feedback circuitry 480 may include feedback resistors RFB1 and RFB2. The resistor RFB2 may be coupled between the output of the second amplifier stage 420 and the input of the second amplifier stage 420. The resistor RFB1 may be coupled between an internal node (shown by node N6) of the second amplifier stage 420 and the input of the first amplifier stage 410. As shown, the internal node N6 is at a source of Q2.

To provide directivity at the directional coupler terminal 406, the amplifier circuitry 401 may be configured to provide a virtual ground node between the first amplifier stage 410 and the second amplifier stage 420, and the directional coupler terminal 406 may be coupled to the virtual ground node.

In one aspect, the amplifier circuitry 410 may further include nulling circuitry 430 coupled between the output of the first amplifier stage 410 and the input of the second amplifier stage 420. The nulling circuitry 410 can include one or more passive elements (e.g., resistor(s), inductor(s), and/or capacitor(s)). The elements or components of the amplifier circuitry 401 can be selected such that a node within the nulling circuitry 430 is a virtual ground node. For instance, the resistors RD1, RS1, RS2, RFB1, and RFB2 and the elements or components in the nulling circuitry 430 can be selected to provide the virtual ground node. The virtual ground node may provide a virtual ground condition such that the directional coupler terminal 404 may output a signal (e.g., a measurement signal) indicative of a forward going signal from the first amplifier stage 410 to the second amplifier stage 420 but without a reverse going signal (or reflective signal) from the output terminal 406. As such, the directional coupler terminal 404 may be coupled to a node (e.g., the node N2) upstream (or in front) of the nulling circuitry 430. In this way, at the directional coupler terminal 406, at least a portion of a forward going signal is present while a reverse going signal is absent (e.g., about zero). The signal (or current) flow in the amplifier circuitry 410 will be discussed more fully below with reference to FIG. 4B.

In another aspect, the nulling circuitry 430 can be omitted, and instead, the resistors RD1, RS1, RS2, RFB1, and RFB2 in the amplifier circuitry 401 can be selected (optimized) to provide a virtual ground node (e.g., the node Nv) between the output of the first amplifier stage 410 and the input of the second amplifier stage 420. As such, the directional coupler terminal 404 can be directly connected to the virtual ground mode Nv. While FIG. 4 illustrates the directional coupler terminal 404 connected to a separate node N2, the nodes N2, N3, and Nv may correspond to the same connection or node. Such a connection can allow for at least a portion of a forward going signal to be present at the directional coupler terminal 404 while a reverse going signal is absent (e.g., about zero) at the directional coupler terminal 404.

Figure 4B:
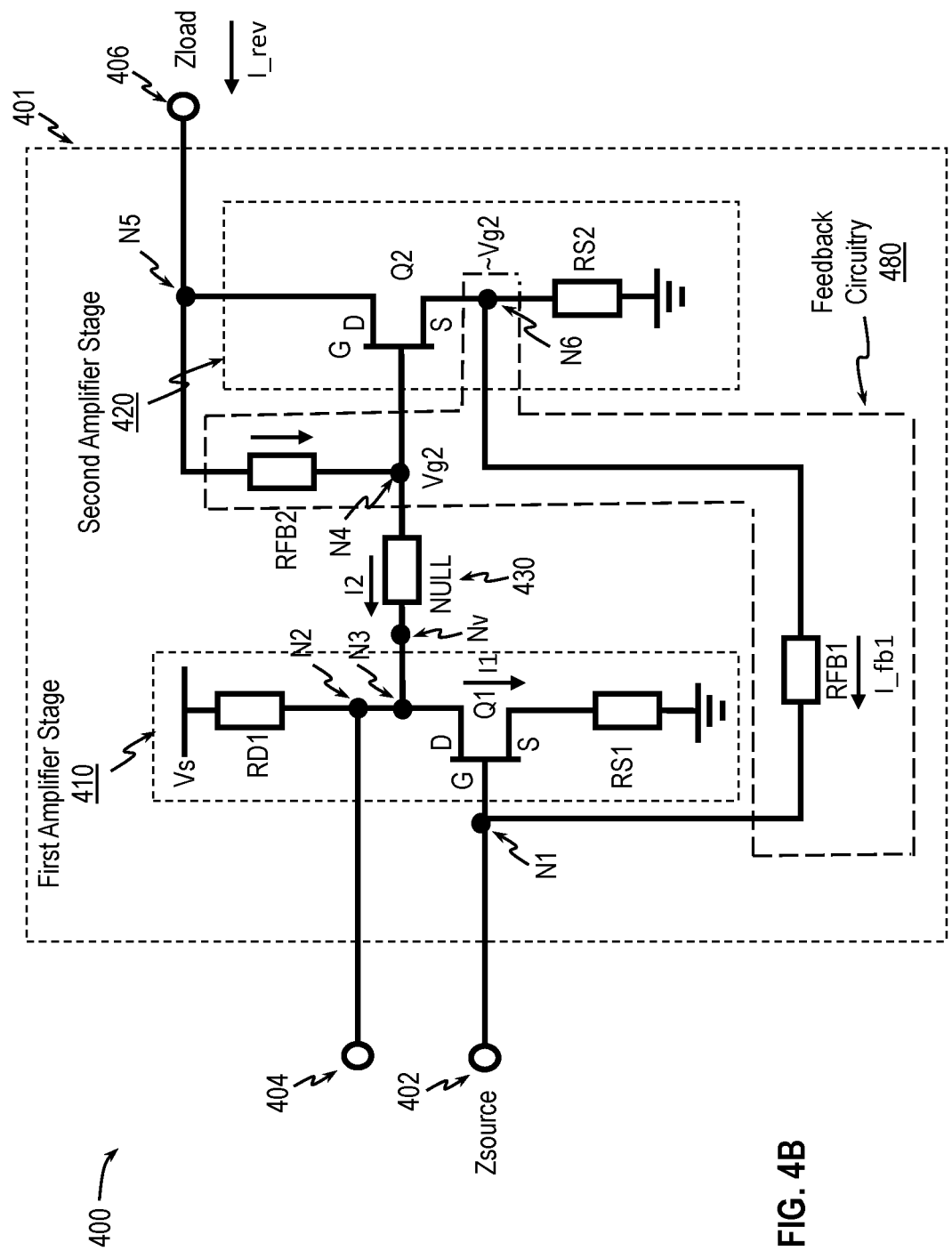
FIG. 4B provides an electric circuit diagram of FIG. 4A, further illustrating various signals during operation of the coupler, according to some embodiments of the present disclosure.

FIG. 4B provides an electric circuit diagram of FIG. 4A, further illustrating various signals during operation of the PA 400, according to some embodiments of the present disclosure. To consider the response to a reverse going signal, consider a reverse current I_rev, shown in FIG. 4B. Much of this current I_rev flows through RFB2 generating Vg2 at the gate of Q2. The source follower action of Q2 implies approximately the same voltage may be present on the source of Q2. A current I_fb will flow through RFB1 creating a voltage Vg1 at the input of the amplifier, as shown in FIG. 4B. Vg1 will in turn generate I1 in Q1, as also shown in FIG. 4B. In some examples, the PA 400 can be configured such that a voltage at the gate of Q2 is non-inverting relative to the internal node N6 while a voltage at the gate of Q1 is inverting relative to the node Nv. In other examples, the PA 400 can be configured such that a voltage at the gate of Q2 is inverting relative to the internal node N6 while a voltage at the gate of Q1 is non-inverting relative to the node Nv. Values around the circuit can be chosen such that a virtual ground condition exists at the measurement port (e.g., directional coupler terminal 404) for reverse signals. This condition exists when the current I2 (flowing from the input of the second amplifier stage 420 to the output of the first amplifier stage 410) is balanced to the current I1 (flowing across Q1). As such, the circuit shown in FIG. 4 is able to monitor forward going signals at the measurement port without responding to reverse going signals. It should be noted that the current I1 and I2 are small signals and not direct current (DC).

Figure 5:
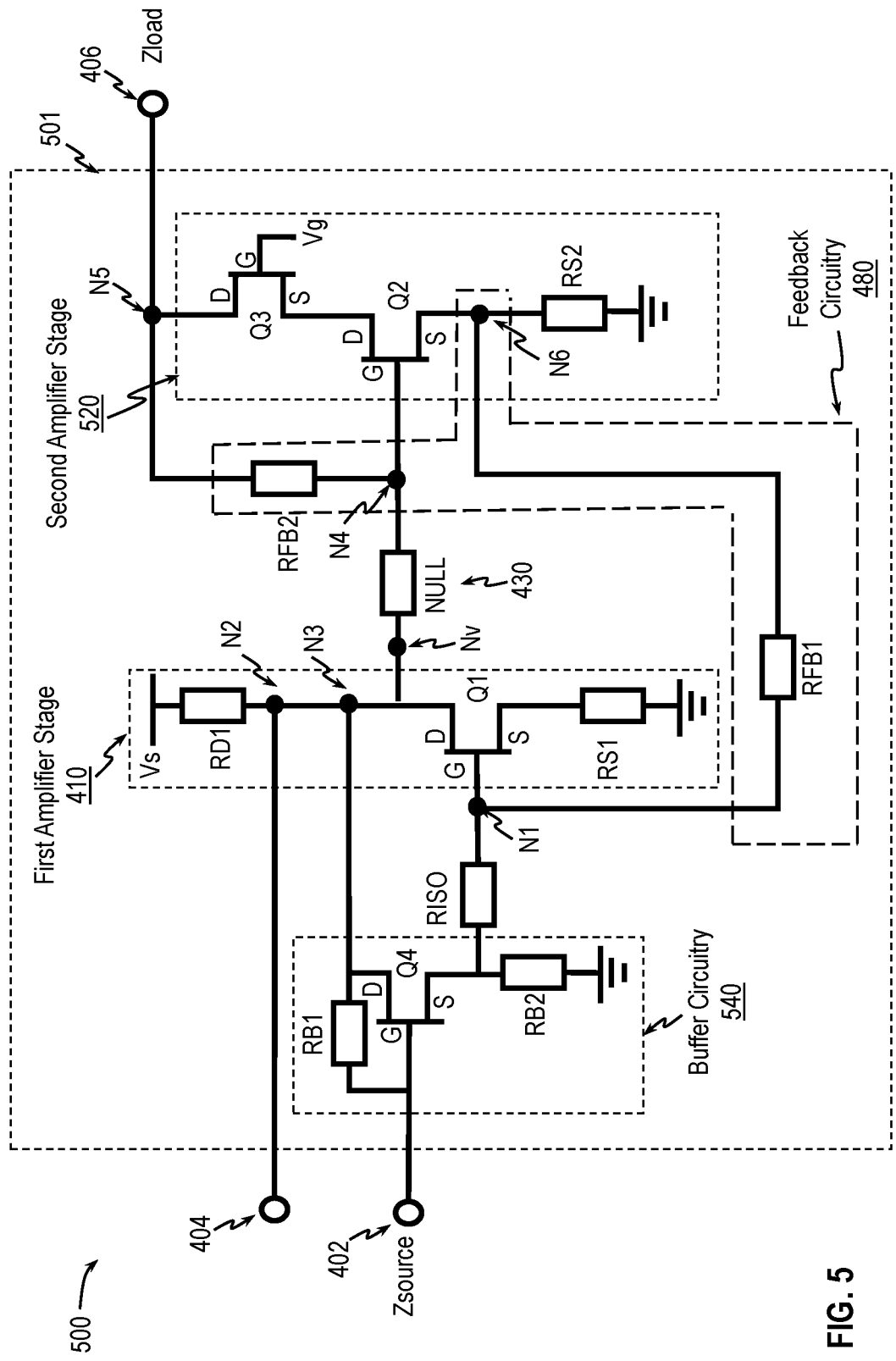
FIG. 5 provides an electric circuit diagram of a PA with an integrated directional coupler, according to other embodiments of the present disclosure.

In some deployment scenarios, dependence on the source impedance, Zsource, may usually be undesirable. Should the source impedance deviate from the anticipated value, the nulling loop may be out of balance and the effective directivity may be somewhat compromised. This can be overcome by converting the first stage into a Darlington stage comprised of Q1 and Q4, and adding an isolating resistor RISO, as shown in FIG. 5, which makes the response of the reverse signal less dependent on the source impedance. In FIG. 5, the output stage is shown as a cascode which is the common topology used in broadband amplifier stages in the CATV industry.

FIG. 5 provides an electric circuit diagram of a PA 500 with an integrated directional coupler, according to other embodiments of the present disclosure. The PA 500 shares many elements with the PA 400 of FIG. 4 and the same reference numerals as in FIG. 4 are used in FIG. 5 to refer to the same or analogous elements of FIG. 4; for brevity, a discussion of these elements is not repeated, and these elements may take the form of any of the embodiments disclosed herein.

For instance, the PA 500 may include amplifier circuitry 501. The amplifier circuity 501 may include a first amplifier stage 410 and a second amplifier stage 520, and feedback circuitry 480 coupled between the output (N5) of the second amplifier stage 520 and the input (N1) of the first amplifier stage 410. However, the PA 500 may further include buffer circuitry 540 coupled between the input terminal 402 and the input (N1) of the first amplifier stage 410. The buffer circuitry 540 may include a transistor Q4, where a gate (shown by G) of Q4 may be coupled to the input terminal 402, a drain (shown by D) of Q4 may be coupled to the gate of the transistor Q3 via a resistor RB1, and a source of Q4 may be coupled to a ground potential via a resistor RB2. Further, an additional resistor RISO can be coupled between the buffer circuitry 540 and the input of the first amplifier stage 410. In this way, the response of the reverse or reflective signal may be less dependent on the source impedance Zsource. The second amplifier stage 520 may include transistors Q2 and Q3 coupled in a cascode topology. More specifically, the drain of Q2 may be coupled to the source of Q3, the drain of Q3 may be coupled to the output (N5) of the second amplifier stage 520, and the gate of Q3 may be coupled to a voltage Vg (a DC bias voltage).

Figure 6:
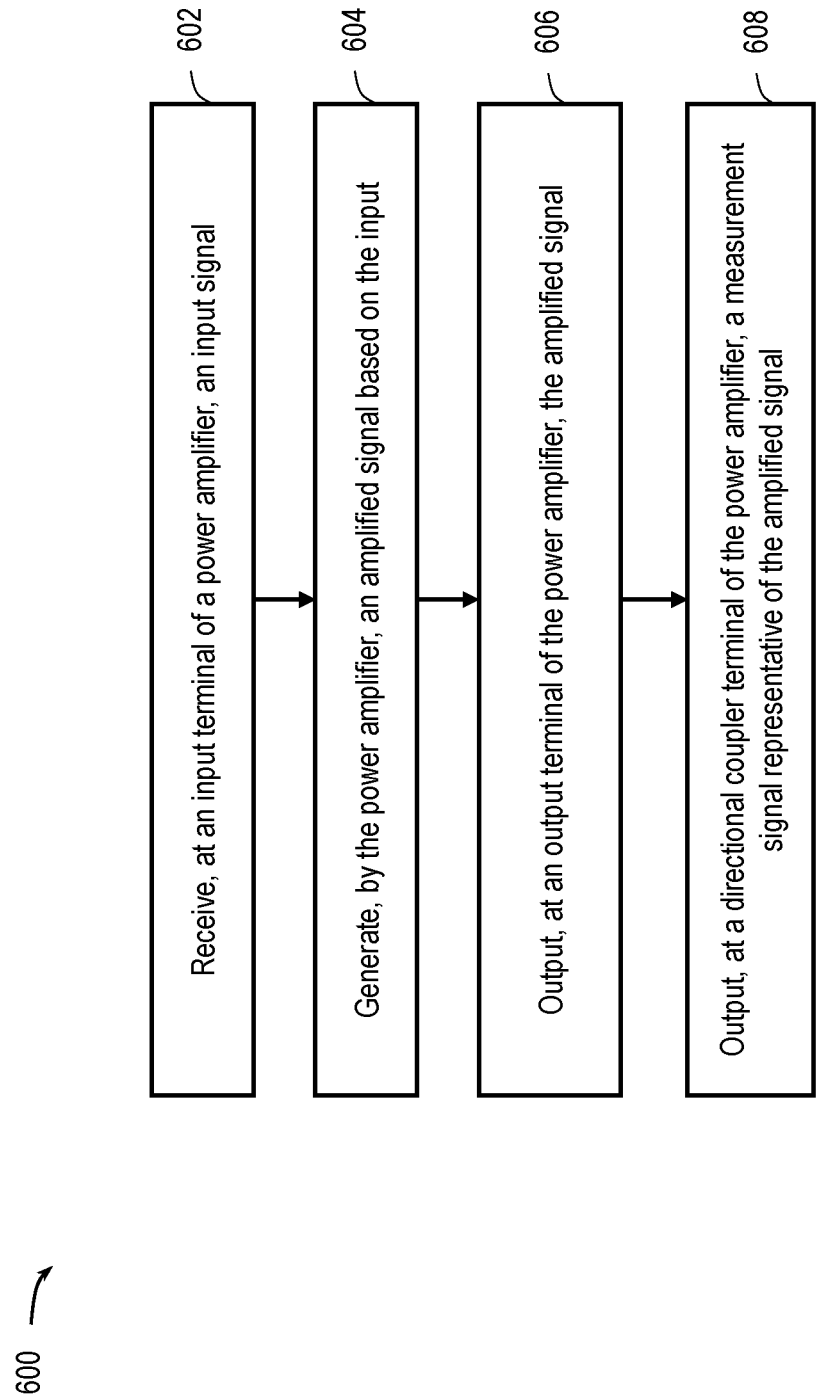
FIG. 6 provides a flow diagram illustrating a method for a PA to provide a directional measurement signal, according to some embodiments of the present disclosure.

FIG. 6 provides a flow diagram illustrating a method 600 for a PA to provide a directional measurement signal, according to some embodiments of the present disclosure. The method 600 can be implemented by the PA 400 and/or 500 with integrated directional couplers discussed above with reference to FIGS. 4-5. Although the operations of the method 600 may be illustrated with reference to particular embodiments of the PAs 400 and 500 disclosed herein, the method 600 may be performed using any suitable hardware components. Operations are illustrated once each and in a particular order in FIG. 6, but the operations may be performed in parallel, reordered, and/or repeated as desired.

At 602, an input signal is received at an input terminal of a PA. In some instances, the PA may correspond to the PA 400 of FIG. 4 or the PA 500 of FIG. 5.

At 604, an amplified signal is generated by the power amplifier based on the input signal.

At 606, the amplified signal is output at an output terminal of the power amplifier.

At 608, a measurement signal representative of the amplified signal is output at a directional coupler terminal (e.g., the directional coupler terminal 404) of the power amplifier. In an example, the measurement signal may be indicative of a power level (e.g., a percentage of the power) of a forward going signal of the PA only and without a reverse going signal or a reflective signal from the output terminal.

In some aspects, a feedback current at an internal node of the power amplifier (to which the directional coupled terminal is coupled) may be balanced so that a virtual ground condition is present at the internal node. For instance, the internal node may correspond to the node Nv of the PA 400, where the current I2 is balanced to I1 as discussed above with reference to FIG. 4B.

In some embodiments, integrated directional couplers for broadband amplifiers as described herein may be included in various RF devices and systems used in wireless communications. For instance, according to a further aspect of the present disclosure, an apparatus (e.g., an RF system, a CATV system, etc.) may include a power amplifier with an input terminal, output terminal, and a directional coupler terminal as discussed above with reference to FIGS. 4-5, where the directional coupler terminal may operate as a measurement port. The apparatus may further include measurement circuitry (e.g., similar to the detector/monitor 130 discussed above with reference to FIGS. 1-3) coupled to the directional coupler terminal. In some instances, the measurement circuitry may monitor the signal output by the directional coupler terminal or perform any suitable detection. In some aspects, the apparatus or system may further include automatic gain control (AGC) circuitry to perform a gain adjustment based on the measurement signal.

For illustration purposes only, one example RF device that may include any of the integrated directional couplers for broadband amplifiers described herein is shown in FIG. 6 and described below. However, in general, integrated directional couplers for broadband amplifiers as described herein may be included in other devices and systems, all of which being within the scope of the present disclosure.

Figure 7:
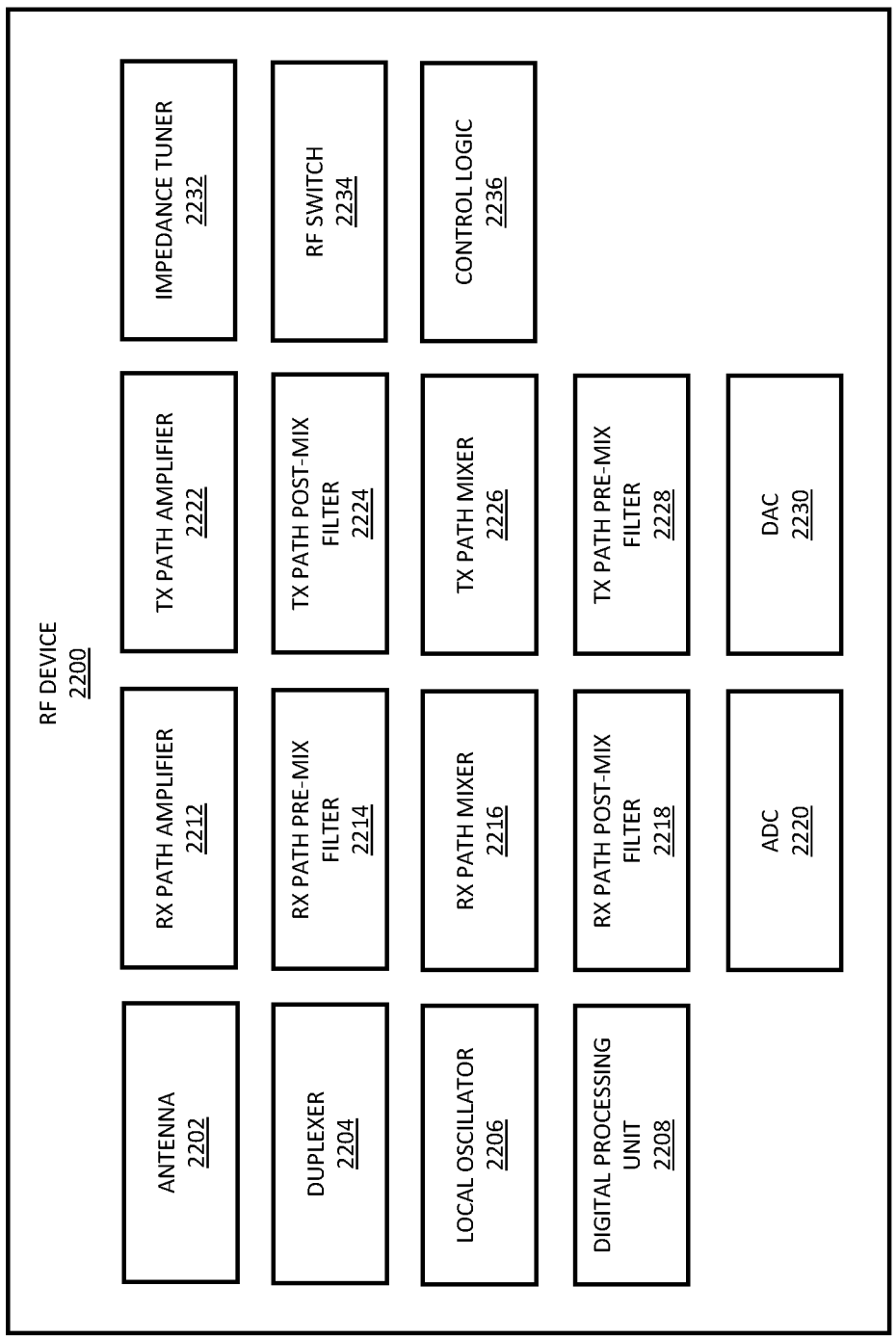
FIG. 7 provides a schematic illustration of an RF device in which one or more integrated directional couplers for broadband amplifiers may be implemented, according to some embodiments of the present disclosure.

FIG. 7 is a block diagram of an example RF device 2200, e.g., an RF transceiver, in which one or more integrated directional couplers for broadband amplifiers may be implemented, according to some embodiments of the present disclosure.

In general, the RF device 2200 may be any device or system that may support wireless transmission and/or reception of signals in the form of electromagnetic waves in the RF range of approximately 3 kilohertz (kHz) to approximately 300 Gigahertz (GHz). In some embodiments, the RF device 2200 may be used for wireless communications, e.g., in a base station (BS) or a user equipment (UE) device of any suitable cellular wireless communications technology, such as GSM, WCDMA, or LTE. In a further example, the RF device 2200 may be used as, or in, e.g., a BS or a UE device of a mm-wave wireless technology such as 5G wireless (i.e., high-frequency/short wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as MRI.

In various embodiments, the RF device 2200 may be included in frequency-division duplexing (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 7 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all the components included in the RF device 2200 may be attached to one or more motherboards. In some embodiments, some or all these components are fabricated on a single die, e.g., on a single system on chip (SOC) die.

Additionally, in various embodiments, the RF device 2200 may not include one or more of the components illustrated in FIG. 7, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or an local oscillator (LO) 2206, but may include device interface circuitry (e.g., connectors and supporting circuitry) to which a digital processing unit 2208 or an LO 2206 may be coupled.

As shown in FIG. 7, the RF device 2200 may include an antenna 2202, a duplexer 2204 (e.g., if the RF device 2200 is an FDD RF device; otherwise, the duplexer 2204 may be omitted), an LO 2206, a digital processing unit 2208. As also shown in FIG. 7, the RF device 2200 may include an RX path that may include an RX path amplifier 2212, an RX path pre-mix filter 2214, a RX path mixer 2216, an RX path post-mix filter 2218, and an analog-to-digital converter (ADC) 2220. As further shown in FIG. 7, the RF device 2200 may include a TX path that may include a TX path amplifier 2222, a TX path post-mix filter 2224, a TX path mixer 2226, a TX path pre-mix filter 2228, and a digital-to-analog converter (DAC) 2230. Still further, the RF device 2200 may further include an impedance tuner 2232, an RF switch 2234, and control logic 2236. In various embodiments, the RF device 2200 may include multiple instances of any of the components shown in FIG. 7. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 7) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 7 as control logic 2236, e.g., an RF FE control interface. In some embodiments, the control logic 2236 may be configured to control at least portions of operating one or more integrated directional couplers for broadband amplifiers. For example, the control logic 2236 may be configured to provide control signals to the integrated directional coupler arrangements as described herein. In another example, the control logic 2236 may be configured to directly control the switches of the integrated directional couplers as described herein. In some embodiments, the control logic 2236 may be used to perform control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wideband antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more LOs 2206, configured to provide LO signals that may be used for downconversion of the RF signals received by the antenna 2202 and/or upconversion of the signals to be transmitted by the antenna 2202.

The RF device 2200 may include the digital processing unit 2208, which may include one or more processing devices. The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 7, in some embodiments, the RF device 2200 may further include a memory device, configured to cooperate with the digital processing unit 2208.

Turning to the details of the RX path that may be included in the RF device 2200, in some embodiments, the RX path amplifier 2212 may include an low-noise amplifier (LNA). In some embodiments, the RX path amplifier 2212 may include an integrated directional coupler according to any embodiments of the present disclosure. An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive LO signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with an LO signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using LO signals whose frequency is identical to, or very close to the carrier frequency of the radio signal. In other embodiments, the RF device 2200 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 7, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the LO signal provided by the LO 2206. The second RX path mixer may be configured for performing downconversion to generate a quadrature (Q) downconverted RX signal by mixing the RX signal received by the antenna 2202 and a quadrature component of the LO signal provided by the LO 2206 (the quadrature component is a component that is offset, in phase, from the in-phase component of the LO signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, like the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted.

Turning to the details of the TX path that may be included in the RF device 2200, the digital signal to later be transmitted (TX signal) by the antenna 2202 may be provided, from the digital processing unit 2208, to the DAC 2230. Like the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a band-pass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Like the RX path mixer 2216, the TX path mixer 2226 may include a pair of TX path mixers, for in-phase and quadrature component mixing. Like the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path LO signal provided from the LO 2206 (in various embodiments, the LO 2206 may include a plurality of different local oscillators or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

In some embodiments, the TX path amplifier 2222 may include one or more PAs. In some embodiments, the TX path amplifier 2222 may include an integrated directional coupler according to any embodiments of the present disclosure.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e. g., the RF switch 2234, configured to selectively switch any one of the plurality of RF filters ON and OFF (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 7, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters ON and OFF) of the RF device 2200. Typically, an RF system would include a plurality of such RF switches.

The RF device 2200 provides a simplified version and, in further embodiments, other components not specifically shown in FIG. 7 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable phased-lock loop (PLL), configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path.

The following paragraphs provide various examples of the embodiments disclosed herein.

Example 1 includes a power amplifier circuit arrangement that provides a directional coupled output, the power amplifier circuit arrangement including an input terminal to receive an input signal; amplifier circuitry including a first amplifier stage, a second amplifier stage, and a virtual ground node, where an input of the first amplifier stage is coupled to the input terminal, an output of the first amplifier stage is coupled to an input of the second amplifier stage via the virtual ground node, and an output of the second amplifier stage is coupled to the input of the first amplifier stage via feedback circuitry; an output terminal coupled to the output of the second amplifier stage, the output terminal to output an amplified signal; and a directional coupler terminal coupled to the virtual ground node.

In Example 2, the power amplifier circuit arrangement of example 1 can optionally include nulling circuitry coupled between the output of the first amplifier stage and the input of the second amplifier stage.

In Example 3, the power amplifier circuit arrangement of example 2 can optionally include where the nulling circuitry includes one or more passive elements.

In Example 4, the power amplifier circuit arrangement of any of examples 2-3 can optionally include where the virtual ground node is an internal node of the nulling circuitry, and the directional coupler terminal is coupled to a node upstream of the nulling circuitry.

In Example 5, the power amplifier circuit arrangement of any of examples 1-4 can optionally include where the feedback circuitry includes a first resistor coupled between the output of the second amplifier stage and the input of the second amplifier stage; and a second resistor coupled between an internal node of the second amplifier stage and the input of the first amplifier stage.

In Example 6, the power amplifier circuit arrangement of any of examples 1-5 can optionally include where the first amplifier stage includes a first transistor having a gate coupled to the input of the first amplifier stage, and a drain coupled to the output of the first amplifier stage; the second amplifier stage includes a second transistor having a gate coupled to the input of the second amplifier stage, and a drain coupled to the output of the second amplifier stage; and the internal node of the second amplifier stage to which the second resistor is coupled is a source of the second transistor.

In Example 7, the power amplifier circuit arrangement of any of examples 1-6 can optionally include where the first amplifier stage further includes a third resistor coupled to the drain of the first transistor; and a fourth resistor coupled to the source of the first transistor; and the second amplifier stage further includes a fifth resistor coupled to the source of the second transistor; and the first, second, third, fourth, and fifth resistors are selected based on a source impedance at the input terminal and a load impedance at the output terminal to provide the virtual ground node.

In Example 8, the power amplifier circuit arrangement of any of examples 1-7 can optionally include buffer circuitry coupled between the input terminal and the input of the first amplifier stage.

In Example 9, the power amplifier circuit arrangement of example 8 can optionally include a resistor coupled between the buffer circuitry and the input of the first amplifier stage.

In Example 10, the power amplifier circuit arrangement of any of examples 1-9 can optionally include where the second amplifier stage includes transistors coupled in a cascode topology.

In Example 11, the power amplifier circuit arrangement of any of examples 10 can optionally include where at least a portion of a forward signal is at the directional coupler terminal; and a reverse signal is about zero at the directional coupler terminal.

Example 12 includes an apparatus including a power amplifier including an input terminal to receive an input signal; amplifier circuitry including a first amplifier stage having an input coupled to the input terminal; and a second amplifier stage having an input coupled to an output of the first amplifier stage, and an output coupled to the input of the first amplifier stage via feedback circuitry; and an output terminal to output an amplified signal; a directional coupler terminal coupled to a node between the output of the first amplifier stage and the input of the second amplifier stage, the directional coupler terminal to output a measurement signal indicative of a forward going signal in a direction from the input terminal to the output terminal, where a reflective signal from the output terminal is absent in the measurement signal; and measurement circuitry coupled to the directional coupler terminal.

In Example 13, the apparatus of claim 12 can optionally include where the amplifier circuitry further includes nulling circuitry coupled between the output of the first amplifier stage and the input of the second amplifier stage and downstream of the node to which the directional coupler terminal is coupled.

In Example 14, the apparatus of any of examples 12-13 can optionally include where the node to which the directional coupler terminal is coupled is a virtual ground node.

In Example 15, the apparatus of any of examples 12-14 can optionally include where the amplifier circuitry further includes buffer circuitry coupled to the input terminal; and a resistor coupled between an output of the buffer circuitry and the input of the first amplifier stage to isolate an input impedance from the amplifier circuitry.

In Example 16, the apparatus of any of examples 12-15 can optionally include where the second amplifier stage further includes at least a first transistor and a second transistor arranged in a cascode topology.

In Example 17, the apparatus of any of examples 12-16 can optionally include where the measurement circuitry includes monitoring circuitry to monitor the measurement signal.

In Example 18, the apparatus of any of examples 12-17 can optionally include automatic gain control circuitry coupled to perform a gain adjustment based on the measurement signal.

Example 19 includes a method including receiving, at an input terminal of a power amplifier, an input signal; generating, by the power amplifier, an amplified signal based on the input signal; outputting, at an output terminal of the power amplifier, the amplified signal; and outputting, at a directional coupler terminal of the power amplifier, a measurement signal representative of the amplified signal.

In Example 20, the method of example 19 can optionally include balancing a feedback current at an internal node of the power amplifier to provide a virtual ground condition, the internal node coupled to the directional coupler terminal.

Example 21 provides an integrated directional coupler as shown in FIG. 4A.

Example 22 provides an integrated directional coupler as shown in FIG. 5.

Example 23 provides the integrated directional coupler according to examples 1 or 2, wherein the nulling circuit is a directional nulling circuit.

Example 24 provides the integrated directional coupler according to any one of the preceding examples, further including a buffer circuit to isolate the source impedance on directivity.

Example 25 provides the integrated directional coupler according to any one of the preceding examples, including specific circuitry used in CATV, such as the cascode topology and differential implementations.

While embodiments of the present disclosure were described above with references to exemplary implementations as shown in FIGS. 1-7, a person skilled in the art will realize that the various teachings described above are applicable to a large variety of other implementations. In certain contexts, the features discussed herein can be applicable to automotive systems, medical systems, scientific instrumentation, wireless and wired communications, radio, radar, and remote sensing systems.

In the discussions of the embodiments above, components of a system, such as transistors, resistors, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to integrated directional couplers for broadband amplifiers as described herein.

Parts of various systems in which one or more integrated directional couplers for broadband amplifiers as proposed herein may be implemented can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors (DSPs), microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a SOC package, either in part, or in whole. An SOC represents an integrated circuit (IC) that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 1-7) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to implementing integrated directional couplers for broadband amplifiers as proposed herein illustrate only some of the possible functions that may be executed by, or within, RF systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. A power amplifier device that provides a directional coupled output, the power amplifier device comprising:
   an input terminal to receive an input signal;
   amplifier circuitry including a first amplifier stage, a second amplifier stage, and a virtual ground node, wherein:
      an input of the first amplifier stage is coupled to the input terminal,
      an output of the first amplifier stage is coupled to an input of the second amplifier stage via the virtual ground node, and
      an output of the second amplifier stage is coupled to the input of the first amplifier stage via feedback circuitry;
   an output terminal coupled to the output of the second amplifier stage, the output terminal to output an amplified signal; and
   a directional coupler terminal coupled to the virtual ground node, with the directional coupler terminal to output a measurement signal representative of the amplified signal, wherein a reflective signal from the output terminal is absent in the measurement signal.

2. The power amplifier device of claim 1, further comprising:
   nulling circuitry coupled between the output of the first amplifier stage and the input of the second amplifier stage.

3. The power amplifier device of claim 2, wherein the nulling circuitry includes one or more passive elements.

4. The power amplifier device of claim 2, wherein:
   the virtual ground node is an internal node of the nulling circuitry, and
   the directional coupler terminal is coupled to a node upstream of the nulling circuitry.

5. The power amplifier device of claim 1, wherein the feedback circuitry comprises:
   a first resistor coupled between the output of the second amplifier stage and the input of the second amplifier stage; and
   a second resistor coupled between an internal node of the second amplifier stage and the input of the first amplifier stage.

6. The power amplifier device of claim 5, wherein:
   the first amplifier stage includes a first transistor having:
      a gate coupled to the input of the first amplifier stage, and
      a drain coupled to the output of the first amplifier stage;
   the second amplifier stage includes a second transistor having:
      a gate coupled to the input of the second amplifier stage, and
      a drain coupled to the output of the second amplifier stage; and
   the internal node of the second amplifier stage to which the second resistor is coupled is a source of the second transistor.

7. The power amplifier device of claim 6, wherein:
   the first amplifier stage further includes:
      a third resistor coupled to the drain of the first transistor; and
      a fourth resistor coupled to the source of the first transistor; and
   the second amplifier stage further includes a fifth resistor coupled to the source of the second transistor; and
   the first resistor, the second resistor, the third resistor, the fourth resistor, and the fifth resistor are selected based on a source impedance at the input terminal and a load impedance at the output terminal to provide the virtual ground node.

8. The power amplifier device of claim 1, further comprising:
buffer circuitry coupled between the input terminal and the input of the first amplifier stage.

9. The power amplifier device of claim 8, further comprising:
a resistor coupled between the buffer circuitry and the input of the first amplifier stage.

10. The power amplifier device of claim 1, wherein the second amplifier stage includes transistors coupled in a cascode topology.

11. An apparatus comprising:
a power amplifier comprising:
an input terminal to receive an input signal;
amplifier circuitry comprising:
a first amplifier stage having an input coupled to the input terminal; and
a second amplifier stage having:
an input coupled to an output of the first amplifier stage, and
an output coupled to the input of the first amplifier stage via feedback circuitry; and
an output terminal to output an amplified signal;
a directional coupler terminal coupled to a node between the output of the first amplifier stage and the input of the second amplifier stage, the directional coupler terminal to output a measurement signal indicative of a forward going signal in a direction from the input terminal to the output terminal, wherein a reflective signal from the output terminal is absent in the measurement signal; and
measurement circuitry coupled to the directional coupler terminal.

12. The apparatus of claim 11, wherein the amplifier circuitry further comprises:
nulling circuitry coupled between the output of the first amplifier stage and the input of the second amplifier stage and downstream of the node to which the directional coupler terminal is coupled.

13. The apparatus of claim 11, wherein the node to which the directional coupler terminal is coupled is a virtual ground node.

14. The apparatus of claim 11, wherein the amplifier circuitry further comprises:
buffer circuitry coupled to the input terminal; and
a resistor coupled between an output of the buffer circuitry and the input of the first amplifier stage to isolate an input impedance from the amplifier circuitry.

15. The apparatus of claim 11, wherein the second amplifier stage further includes at least a first transistor and a second transistor arranged in a cascode topology.

16. The apparatus of claim 11, wherein the measurement circuitry comprises:
monitoring circuitry to monitor the measurement signal.

17. The apparatus of claim 11, further comprising:
automatic gain control circuitry coupled to perform a gain adjustment based on the measurement signal.

18. A method comprising:
receiving, at an input terminal of a power amplifier, an input signal;
generating, by the power amplifier, an amplified signal based on the input signal;
outputting, at an output terminal of the power amplifier, the amplified signal; and
outputting, at a directional coupler terminal of the power amplifier, a measurement signal representative of the amplified signal, wherein a reflective signal from the output terminal is absent in the measurement signal.

19. The method of claim 18, further comprising:
balancing a feedback current at an internal node of the power amplifier to provide a virtual ground condition at the internal node, the internal node coupled to the directional coupler terminal.

* * * * *